United States Patent [19]
Arai et al.

[11] Patent Number: 5,349,669
[45] Date of Patent: Sep. 20, 1994

[54] DATA WRITE CONTROL MEANS

[75] Inventors: Yasuo Arai; Hisatake Sato, both of Tokyo, Japan

[73] Assignee: Oki Electric Industry Co., Ltd., Tokyo, Japan

[21] Appl. No.: 12,618

[22] Filed: Feb. 2, 1993

Related U.S. Application Data

[63] Continuation of Ser. No. 566,453, Aug. 19, 1990, abandoned.

[30] Foreign Application Priority Data

Dec. 21, 1988 [JP] Japan .................................. 63-323055

[51] Int. Cl.$^5$ ............................................ G06F 12/16
[52] U.S. Cl. ...................................... 395/750; 395/425; 365/226; 364/DIG. 1; 364/246.6; 364/246.9; 364/273.5; 364/266.2
[58] Field of Search .................... 395/750, 425, 325; 365/195, 226, 228, 229

[56] References Cited

U.S. PATENT DOCUMENTS

| | | | |
|---|---|---|---|
| 3,624,617 | 11/1971 | Putterman | 395/425 |
| 3,816,768 | 6/1974 | Stein | 307/296 |
| 4,439,804 | 3/1984 | Riddle et al. | 361/92 |
| 4,445,198 | 4/1984 | Eckert | 364/464.02 |
| 4,493,031 | 6/1985 | Silverio | 395/425 |
| 4,534,018 | 8/1985 | Eckert et al. | 365/228 |
| 4,580,246 | 4/1986 | Sibigtroth | 365/189 |
| 4,612,632 | 9/1986 | Olsen | 365/226 |
| 4,692,903 | 9/1987 | Borg et al. | 365/226 |
| 4,799,185 | 1/1989 | Taylor | 395/575 |
| 4,811,287 | 3/1989 | Kupersmith et al. | 365/228 |
| 4,815,041 | 3/1989 | Baylock | 365/229 |
| 4,937,792 | 6/1990 | Suzuki et al. | 365/195 |
| 5,001,670 | 3/1991 | Slate et al. | 365/228 |
| 5,016,219 | 5/1991 | Nolan et al. | 365/228 |
| 5,047,987 | 9/1991 | Kosuge | 365/228 |
| 5,119,336 | 6/1992 | Itoh | 365/195 |

FOREIGN PATENT DOCUMENTS

| | | | |
|---|---|---|---|
| 0181943 | 5/1986 | European Pat. Off. | G06F 1/00 |
| 0186832 | 7/1986 | European Pat. Off. | G11C 5/00 |
| 0250242 | 12/1987 | European Pat. Off. | G11C 17/00 |
| 61-283939 | 12/1986 | Japan | G06F 12/16 |
| 62-74137 | 4/1987 | Japan | G06F 12/16 |
| 62-74139 | 4/1987 | Japan | G06F 12/16 |
| 62-157955 | 7/1987 | Japan | G06F 12/16 |

*Primary Examiner*—Michael R. Fleming
*Assistant Examiner*—Ayaz R. Sheikh
*Attorney, Agent, or Firm*—Edward D. Manzo

[57] ABSTRACT

The present invention relates to a data protection (310) for preventing data from being erroneously written in a data holding circuit (307). A data protection circuit (311) receives a data protection set release select signal Sa provided by a processor (330), thereby causing a second timer (316) to start timing. The data protection circuit (311) further detects the level of a chip select signal CS provided by a power supply monitoring circuit (320) after the second timer (316) timed the time interval T2 and provides a data protection signal DP corresponding to the signal Sa to the data holding circuit (307) only in the case that the data protection circuit (311) judged that the main power supply (305) is at normal state.

18 Claims, 7 Drawing Sheets

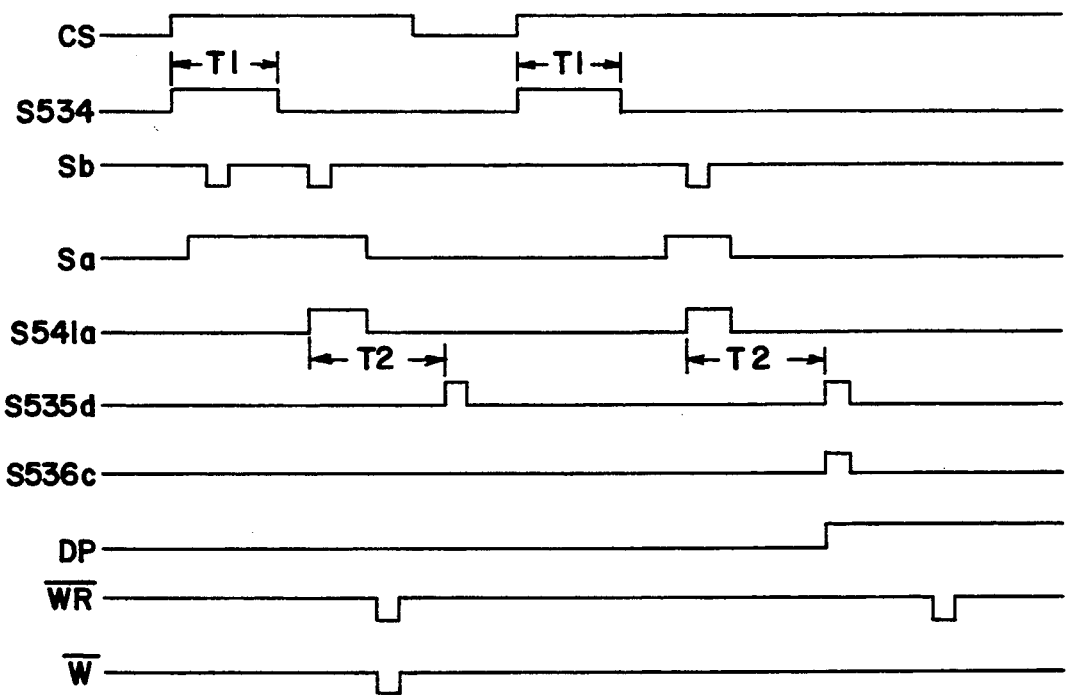
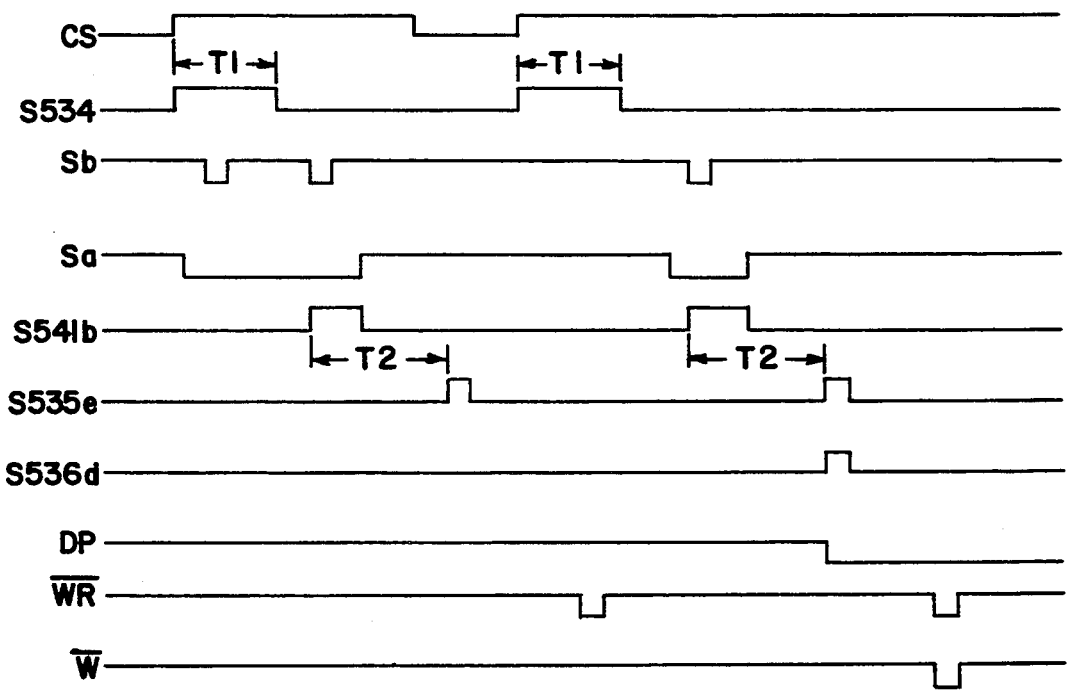

DATA WRITE CONTROL MEANS

This is a continuation of copending application(s) Ser. No. 07/566,453 filed on Aug. 19, 1990.".

TECHNICAL FIELD

The present invention relates to a data write control means for writing data in a data holding circuit of a semiconductor memory, an electronic timer, etc. which hold the data by a backup power supply when a main power supply is broken, particularly, the data write control means having a function to prevent destruction of the stored data caused by an erroneous write signal generated at the time when the main power supply is switched to the backup power supply.

BACKGROUND ART

There are disclosed the data holding circuits for preventing destruction of the stored data in Japanese Patent Laid-Open Publication No. 55-23583, Utility Model Laid-Open Publication No. 57-110799, Patent Laid-Open Publication No. 58-94200, Utility Model Laid-Open Publication No. 59-84642, Patent Laid-Open Publication No. 61-283939, Utility Model Laid-Open Publication No. 62-53738, Patent Laid-Open Publication No. 63-15346 and Utility Model Laid-Open Publication No. 63-44296, an example which will be described with reference to FIG. 1.

A data protection circuit 10 comprises an inverter 1 and a 2 input NAND gate 12. One input terminal 12a of the 2 input NAND gate 12 receives a chip select signal CS from a power supply monitoring circuit 20 and another input terminal 12b receives an external write control signal WR from a processor 30 by way of inverter 11. Accordingly, an output of the 2 input NAND gate 12, i.e. a signal level of an internal write control signal $\overline{W}$ as an output of the data protection circuit 10 conforms to a high (H) or a low (L) signal of the external write control signal WR in the case that the chip select signal CS is a high (select) level (hereinafter referred to as H level) and is kept always at H level irrespective of the level of the external write control signal $\overline{WR}$ in the case that the chip select signal CS is low (nonselect) level (hereinafter referred to as L level).

The data holding circuit 40 receives the internal write signal $\overline{W}$ so that it becomes in a data write enable state in the case that the internal write control signal $\overline{W}$ is at H level and in a data write inhibiting state in the case that the internal write control signal $\overline{W}$ is at L level. The data holding circuit 40 receives a voltage $V_m$ from the main power supply 51 or $V_b$ from the backup power supply 52 by way of the power supply selector switch 50, hence it can hold the data on the basis of the voltage $V_b$ from a backup power supply 52 even if the main power supply 51 is broken. The voltage from the output 53 of the selector switch 50 is also supplied to the data protection circuit 10 and the power supply monitoring circuit 20. Whereupon, the voltage $V_m$ provided by the main power supply 51 is supplied to the processor 30 which is monitored by the power supply monitoring circuit 20.

An operation of the circuit set forth above will be described with reference to FIG. 2.

The power supply monitoring circuit 20 causes the chip select signal CS to be at L level when it detects that the voltage $V_m$ of the main power supply 51 reaches a first predetermined voltage $V_{m1}$. Inasmuch as the internal write control signal $\overline{W}$ as the output of the data protection circuit 10 is always kept at H level, the data holding circuit 40 is in the write inhibiting state.

The power supply monitoring circuit 20 drives the selector switch 50 to switch the main power supply 51 to the backup power supply 52 when it detects that the voltage $V_m$ of the main power supply 51 is less than a second predetermined voltage $V_{m2}$.

When the main power supply 51 is recovered, the power supply monitoring circuit 20 detects that the voltage $V_m$ of the main power supply 51 exceeds the second predetermined voltage $V_{m2}$ for thereby driving the selector switch 50 to switch to the main power supply 51 from the backup power supply 52, and thereafter provide the chip select signal CS of H level after the lapse of time t1.

With the operation set forth above, according to the circuit as illustrated in FIG. 1, the voltage exceeding the voltage $V_b$ is always supplied to the data holding circuit 40 from the output 53 of the selector switch 50 as illustrated in FIG. 2 so that the circuit can inhibit the data holding circuit 40 from writing the data therein from the time when the data holding circuit 40 detects that the voltage $V_m$ of the main power supply 51 is less than the first predetermined voltage $V_{m1}$ up to the time when the voltage $V_m$ increases to the voltage sufficient to normally drive the processor (operation assurance voltage).

However, inasmuch as the conventional data holding circuit can not detect the breakage of the main power supply until the voltage $V_m$ of the main power supply 51 is reduced to the first predetermined voltage $V_{m1}$, the data holding circuit 40 becomes in a state of write enable state when the processor 30 provides the external write control signal $\overline{WR}$ of L level during the period from the time when the main power supply is broken up to the time when the voltage $V_m$ of the main power supply is less than the first predetermined voltage $V_{m1}$ (power supply unstable period). At this state, there is a likelihood that the data is destructive when the data is written in the data holding circuit 40. Since the operation assurance voltage of the processor 30 is generally higher than the first predetermined voltage $V_{m1}$, the processor 30 is not in a normal sate and liable to provide the erroneous write control signal during the power supply unstable period. Hence, the conventional holding circuit is deemed to be insufficient to protect the data with assurance.

DISCLOSURE OF THE INVENTION

A data write control means according to the present invention is characterized in comprising:

a data holding means for receiving a voltage from a main power supply or a backup power supply;

a first means for providing a first signal having a a first level and a second level, said first means providing the first signal of the first level in case that the main power supply voltage exceeds a predetermined voltage, otherwise providing the first signal of the second level;

a second means for providing a write control signal composed of an active level and an inactive level and a data protection control signal including a third level;

a third means for receiving the write control signal and providing a second signal composed of an active level and an inactive level, the third means providing the second signal of the active or the inactive level in response to the write control signal in case that the first signal is at first level, and providing the second signal of the inactive level in case that the first signal is at the second level;

a fourth means for receiving the data protection control signal and providing a third signal composed of an active level and an inactive level, the fourth means providing the third signal of the active level in case that the first signal is at first level after the lapse of a first predetermined time upon reception of the data protection control signal of the third level, and providing the third signal of the inactive level in case that the first signal is at second level after the lapse of the first predetermined time upon reception of the data protection control signal of the third level; and a fifth means for receiving the second and the third signals for thereby enabling the data protection circuit to write the data therein or inhibiting the data protection circuit from writing the data therein, the fifth means enabling the data holding circuit to write the data therein in case that both the second and the third signals are at active levels, otherwise inhibiting the data holding circuit from writing the data therein.

BEST MODE FOR CARRYING OUT THE INVENTION

Figure 1:
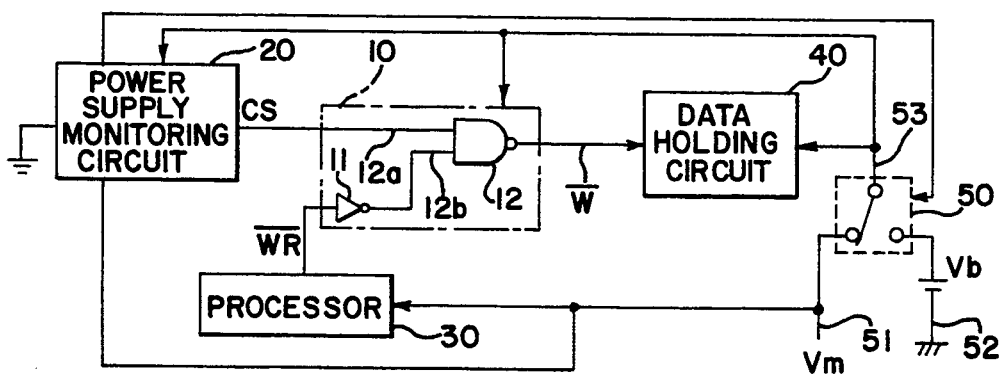
FIG. 1 is a schematic view showing a conventional data write control means.
Figure 2:
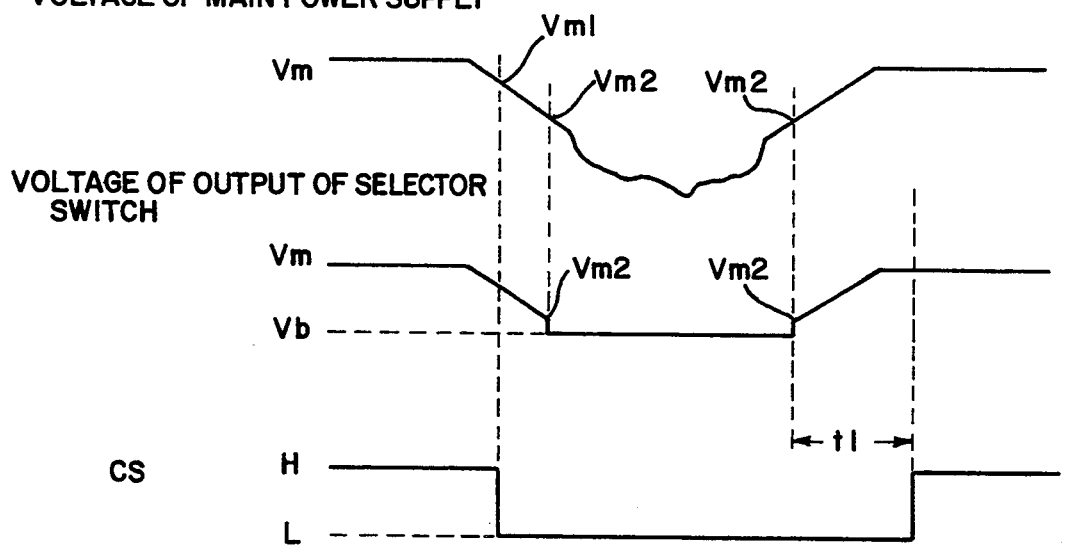
FIG. 2 is a timing diagram in a part of the circuit as illustrated in FIG. 1.
Figure 3:
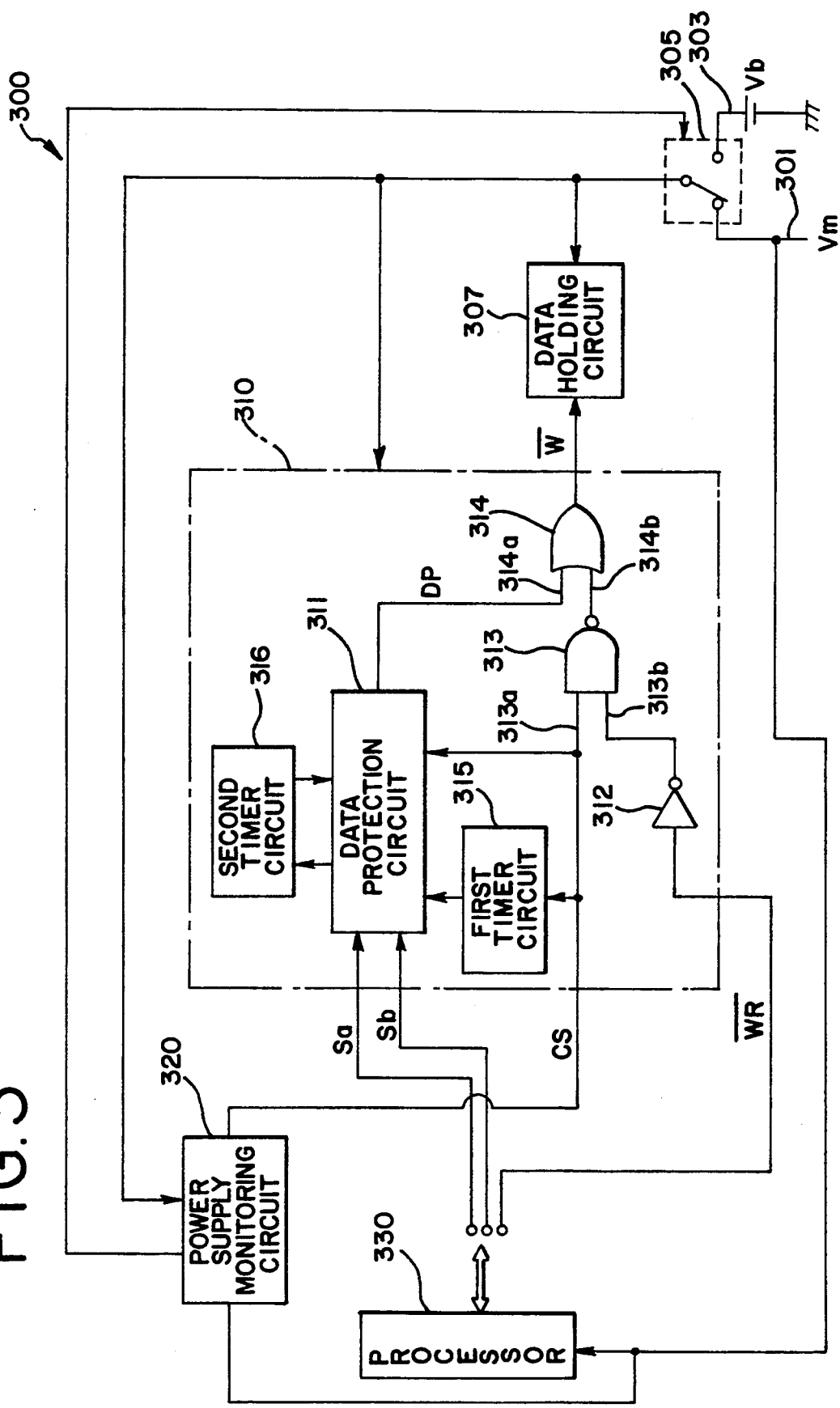
FIG. 3 is schematic view of a first embodiment of the present invention.

FIG. 3 illustrates a data write control means 300 according to a first embodiment of the present invention.

The data write control means 300 has a data holding circuit 307 to which a voltage $V_m$ of a main power supply 301 or a voltage $V_b$ of a backup power supply 303 is supplied by way of a selector switching circuit 305.

An output voltage ($V_m$ or $V_b$) of the selector switching circuit 305 is also supplied to a data protection means 310 and a power supply monitoring circuit 320. The voltage $V_m$ of the main power supply 301 is supplied to a processor 330 which is monitored by the power supply monitoring circuit 320. The power supply monitoring circuit 320 provides a chip select signal CS of a first level which is "H" level to the data protection means 310 in the case that the voltage $V_m$ of the main power supply 301 exceeds a first predetermined voltage and supplies the chip select signal CS of a second level which is "L" level to the data protection means 310 in the case that the voltage $V_m$ of the main power supply 301 is less than a first predetermined voltage. Furthermore, the power supply monitoring circuit 320 drives the selector switching circuit 305 to thereby switch the main power supply 301 to the backup power supply 303 when the voltage $V_m$ of the main power supply 301 is less than the second predetermined voltage which is lower than the first predetermined voltage in the same way as the conventional power supply monitoring circuit.

There is employed, for example, a microcomputer of Intel's 8021H as the processor 330. The microcomputer 8021H has a PORT#1 provided with pins 10 to 12 in which the pin 10 can assign a write signal Sb to a data protection circuit 311, the pin 11 can assign a data protection set release select signal Sa to the data protection circuit 311 and the pin 12 can assign a write control signal $\overline{WR}$ to an inverter 312.

The data protection means 310 comprises the inverter 312 and a 2 input NAND gate 313. An input terminal 313a of the 2 input NAND gate 313 receives the chip select signal CS (hereinafter referred to as CS signal) from the power supply monitoring circuit 320 and another input terminal 313b receives the write control signal $\overline{WR}$ from the processor 330 by way of the inverter 312. Accordingly, a level of the output signal of the 2 input NAND gate 313 conforms to an active level (L level) or an inactive level (H level) of the signal level of the write control signal $\overline{WR}$ in the case that the CS signal is at "H" level and is always at the inactive level ("H" level) irrespective of the signal level of an external write control signal $\overline{WR}$ in the case that the CS signal is at "L" level. An output of 2 input NAND gate 313 is applied to an input 314b of an OR gate 314.

The CS signal is also supplied to a first timer means 315 and the data protection circuit 311. The first timer means 315 starts to time at the rise time of the CS signal when the CS signal is varied from a second level ("L" level) to a first level ("H" level) and provides an output signal to the data protection circuit 311 after the lapse of a predetermined time T1 (e.g. 100 ms) and comprises a one-shot pulse generator circuit and the like.

The data protection circuit 311 receives the data protection set release select signal Sa (hereinafter referred to as Sa signal) and a write signal Sb for writing the Sa signal (hereinafter referred to as Sb signal) from the processor 330. The Sb signal is a control signal to inhibit the data protection circuit 311 from reading the Sa signal therein or to permit reading the Sa signal therefrom. The data protection circuit 311 reads the Sa signal when the Sb signal is at "L" level and does not read the Sa signal when the Sb signal is at "H" level. Furthermore, the data protection circuit 311 does not detect that the Sb signal is at "L" level for the period during the first timer means 315 times the predetermined period T1.

The data protection circuit 311, upon detection of the Sb signal being at "L" level, reads the Sa signal and permit the second timer means 316 to start timing of a predetermined time T2 (e.g. 50 to 200 ms). The data protection circuit 311 reads the CS signal, after completion of timing of the predetermined time T2 by the second timer means 316, and successively provides a data protection signal DP (hereinafter referred to as DP signal) of an active level ("L" level) or an inactive level ("H" level) in response to the Sa signal in case that the CS signal is at "H" level, and successively provides the DP signal provided at the time when the Sb signal is applied thereto in case that the CS signal is at "L" level. At the actuation of the data protection means 310, the level of the DP signal provided by the data protection circuit 311 can be selected at "L" or "H" and is preferable to be set at "H" level.

The OR gate 314 receives the DP signal at one input terminal 314a and an output signal of the NAND gate 313 at the other input terminal 314b and provides an "L" level signal W to the data holding circuit 307 for allowing the data holding circuit 307 to be at a write enable state only in case that both the signals are at active levels ("L" level), otherwise provides an "H" level signal $\overline{W}$ to the data holding circuit 307 for allowing the data holding circuit 307 to be at a write inhibit state.

Figure 4:
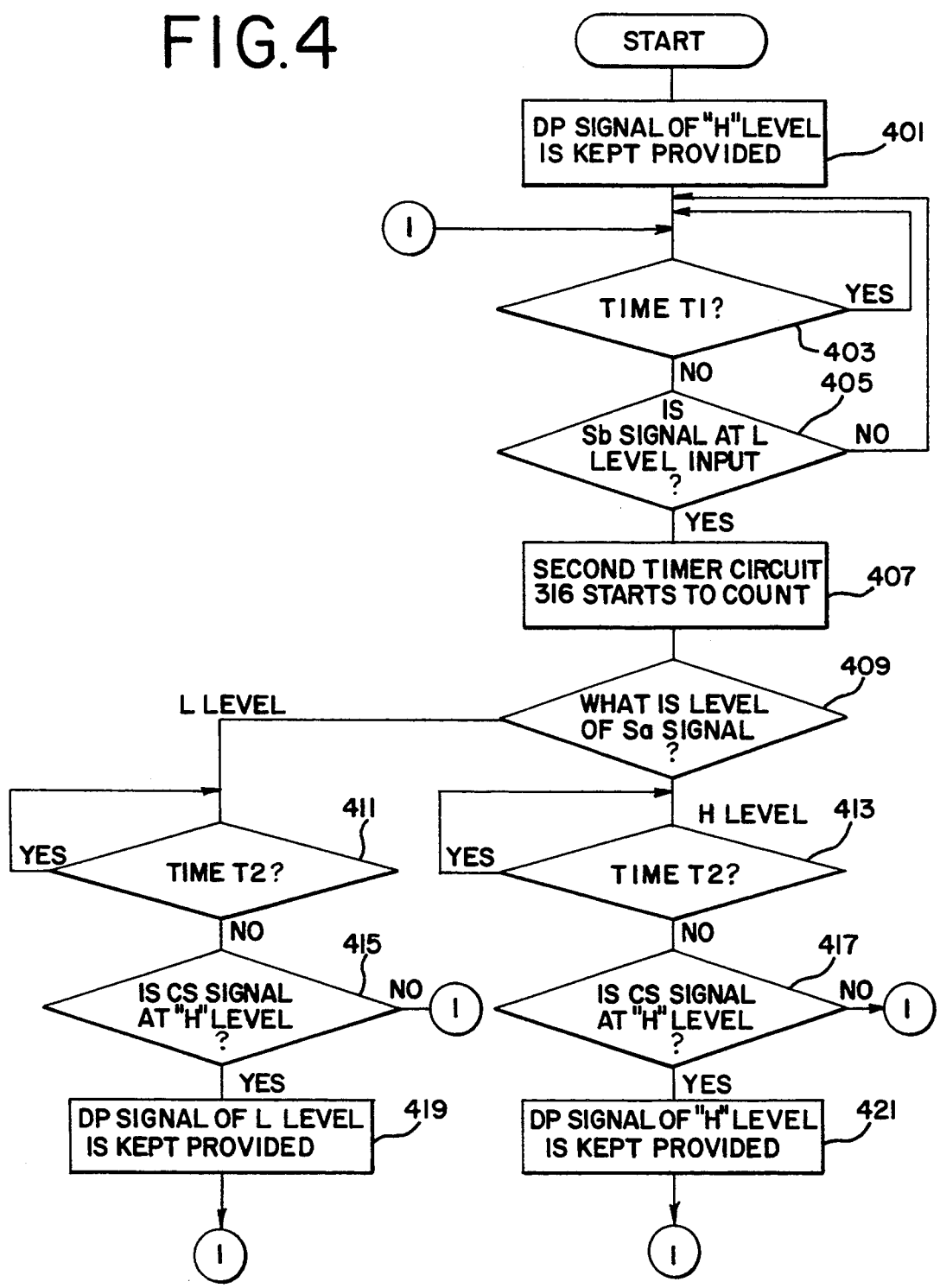
FIG. 4 is a flow chart showing a control operation of a data protection means 310 as illustrated in FIG. 3.

An operation of the data protecton circuit 311 will be described with reference to the flowchart as illustrated at FIG. 4.

The data protection circuit 311 successively provides the DP signal of "H" level by an actuation switch, not shown, of the data write control means 300 until it provides another DP signal (Step 401). Next, in Step 403, the data protection circuit 311 judges as to whether the first timer means times the time T1 and the program proceeds to Step 405 only in case that the first timer means completes the timing of the time T1. In Step 405, the data protection circuit 311 detects the Sb signal and the program returns to Step 403 in case that the Sb signal is at "H" level and proceeds to Step 407 in case that the Sb signal is at "L" level.

In Step 407, the data protection circuit 311 allows the second timer means 407 to start timing and detects the level of the Sa signal in Step 409 and the program proceeds to Step 411 in case that the Sa signal is at "L" level and to Step 413 in case that the Sa signal is at "H" level. In Steps 411 and 413, the data protection circuit 311 judges as to whether the second timer means 316 completes timing of the time T2 and the program proceeds to Steps 415, 417 when the data protection circuit 311 judged that the second timer means 316 completed timing.

In Step 415, the data protection circuit 311 judges as to whether the level of the CS signal is at "H" level and the program returns to Step 403 in case that the CS signal is not at "H" level and the data protection circuit 311 allows the DP signal of "L" level to be kept provided until another DP signal is provided (Step 419), and the program returns to Step 403.

Meanwhile, in Step 417, the data protection circuit 311 judges as to whether the level of the CS signal is at "H" level and the program returns to Step 403 in case that the CS signal is not at "H" level and the data protection circuit 311 allows the DP signal of "H" level to be kept provided until another DP signal is provided (Step 421), and the program returns to Step 403.

A concrete arrangement of the data protection means 310 of FIG. 3 will be described with reference to FIG. 5.

In the data protection means 310, a first timer means 534 comprises a rise time detecting circuit 534a for detecting the rise time of the chip select signal CS and a one-shot pulse generator 534b for generating a one-shot pulse S534 having the pulse width of the time interval T1 upon reception of the output of the rise time detecting circuit 534a. A second timer means 535 comprises an oscillator 535a for generating a pulse having a given cycle, counters 535b, 535c for receiving signals S541a, S541b to start counting the time T2 and providing output signals, and one-shot pulse generator circuits 535d, 535e for receiving the outputs of the counters 535b, 535c and providing one-shot pulses S535d, S535e each having given pulse width.

Figure 5:
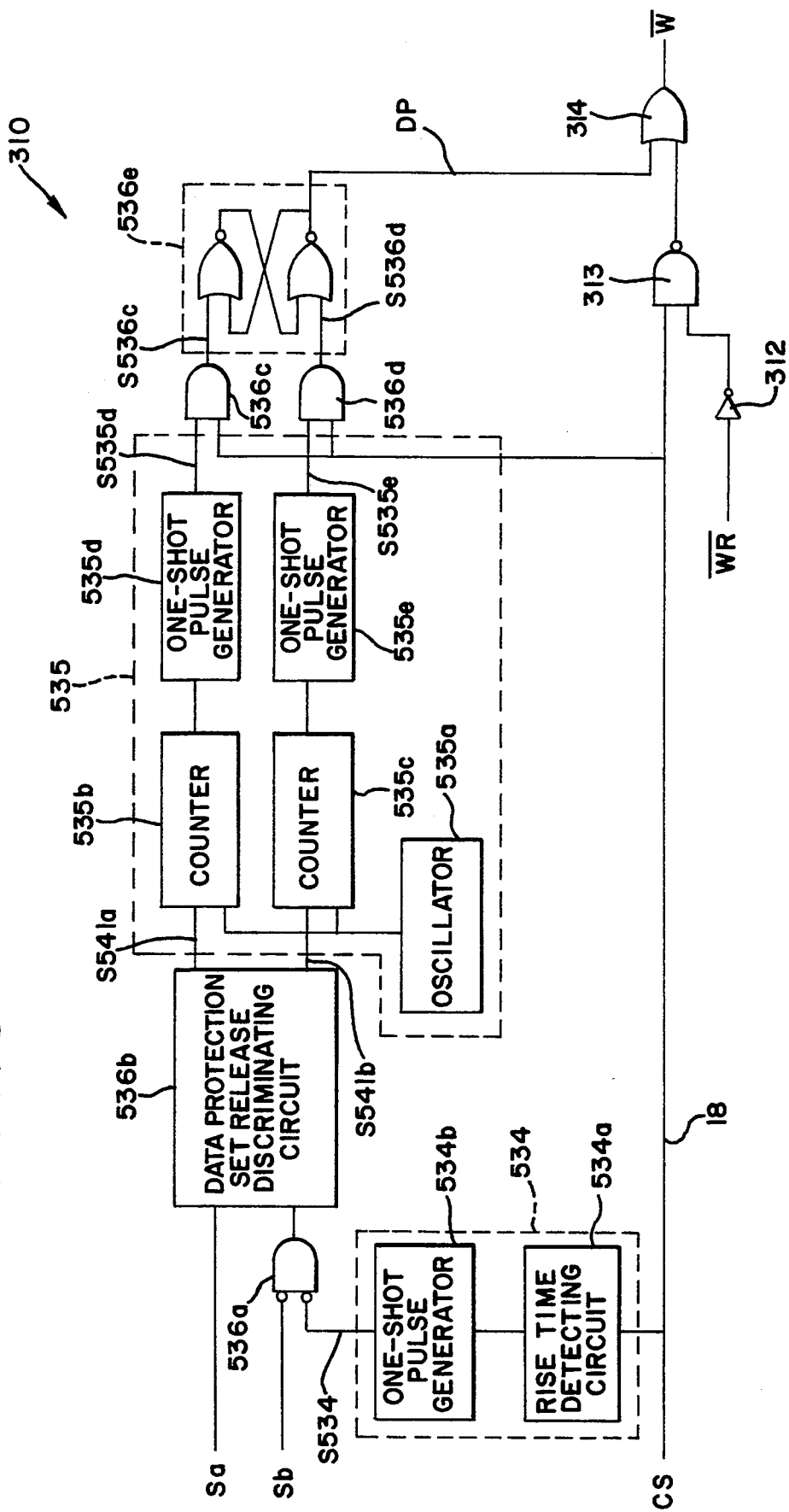
FIG. 5 is a view explaining an arrangement of the data protection means 310 as illustrated in FIG. 3, FIG. 6a and FIG. 6b are timing diagrams showing operations of the data protection means 310 as illustrated in FIG. 5.

The data protection circuit 311 as illustrated in FIG. 5 comprises a NOR gate 536a, a data protection set release discriminating circuit 536b, AND gates 536c, 536d and a reset set type flip-flop (hereinafter referred to as RS-FF) 536e. The NOR gate 536a has a function to receive the data protection set release select signal Sa after the lapse of the predetermined time T1 on the basis of the write signal Sb. The data protection set release discriminating circuit 536b receives data protection set release select signal Sa on the basis of the output of the NOR gate 536a, thereby discriminating the setting mode or the releasing mode whereby the data protection set release discriminating circuit 536b provides the signal S541a to the counter 535b in the case of setting mode and provides the signal S541b to the counter 535c in the case of relesing mode. The one-shot pulses S535d, S535e and the chip select signal CS are ANDed by the AND gates 536c, 536d which provides the set signal S536c, the reset signal S536d. The RS-FF 536e is set or reset by the set signal S536c or the reset signal S536d to provide the data protection signal DP to the OR gate 314.

An operation of the data protection circuit FIG. 5 will be described with reference to FIGS. 6(a), (b), FIGS. 6(a), (b) are waveforms of the operation of FIG. 5 in the setting and releasing modes of the data protection signal.

When the main power supply $V_m$ is selected, the chip select signal CS rises and the rise time detecting circuit 534a detects the rise time of the chip select signal CS and provides a detected signal to the one-shot pulse generator 534b. The one-shot pulse generator 534b, upon reception of the signal from the rise time detecting circuit 534a, provides the one-shot pulse S534 having the pulse width of the time T1 to the NOR gate 536a. The NOR gate 536a is turned off by the one-shot pulse S534. Hence, the write signal Sb input to the NOR gate 536a during the one-shot pulse S534 is output is not input to the data protection set release discriminating circuit 536b but only the data protection set release write signal Sa which is input to the data protection set release discriminating circuit 536b after the time interval T1.

The data protection set release discriminating circuit 536b receives the data protection set release select signal Sa on the basis of the output of the NOR gate 536a to discriminate the setting of the data protection (Sa="H") or the releasing of the data protection (Sa="L"). The data protection set release discriminating circuit 536b provides the signal S541a in the case of setting the data protection (Sa="H") to actuate the counter 535b and provides the signal S541b as illustrated in FIG. 6(b) in the case of releasing the data protection to thereby actuate the counter 535c. The counter 535b, upon reception of the signal S541a, starts to count and provides the signal to the one-shot pulse generator circuit 535d upon completion of counting of the time T2 in response to a frequency of the oscillator 535a. Hence, the one-shot pulse generator circuit 535d provides the one-shot pulse S535d which is sufficient to set the RS-FF 536e to the AND gate 536c. Similarly, the other counter 535c, upon reception of the signal S541b, starts to count and provides the signal to the one-shot pulse generator circuit 535e upon timing the time T2 in response to a frequency of the oscillator 535a. Hence, the one-shot pulse generator circuit 535e provides the one-shot pulse S535e which is sufficient to reset the RS-FF 536e to the AND gate 536d.

Inasmuch as the AND gates 536c, 536d are turned off in the case that the chip select signal CS is at "L" level after the counter 535b or 535c counted the given time T2, the set or the release of the data protection is not effected. On the other hand, in the case that the chip select signal CS is at "H" level the RS-FF 536 is set (DP="H") or reset (DP="L") by the set signal S536 or the reset signal S536c by way of the AND gates 536c, 536d for thereby setting or releasing the data protection. When the data protection is set (DP="H"), even if the write control signal WR is input to the inverter 312 the internal write control signal W is not generated (i.e. the signal $\overline{W}$ is at "H" level) but the external write signal $\overline{WR}$ is supplied as the internal write signal $\overline{W}$ to the data holding circuit 307 as illustrated in FIG. 3 only in the case that the data protection is releasd.

Figure 7:
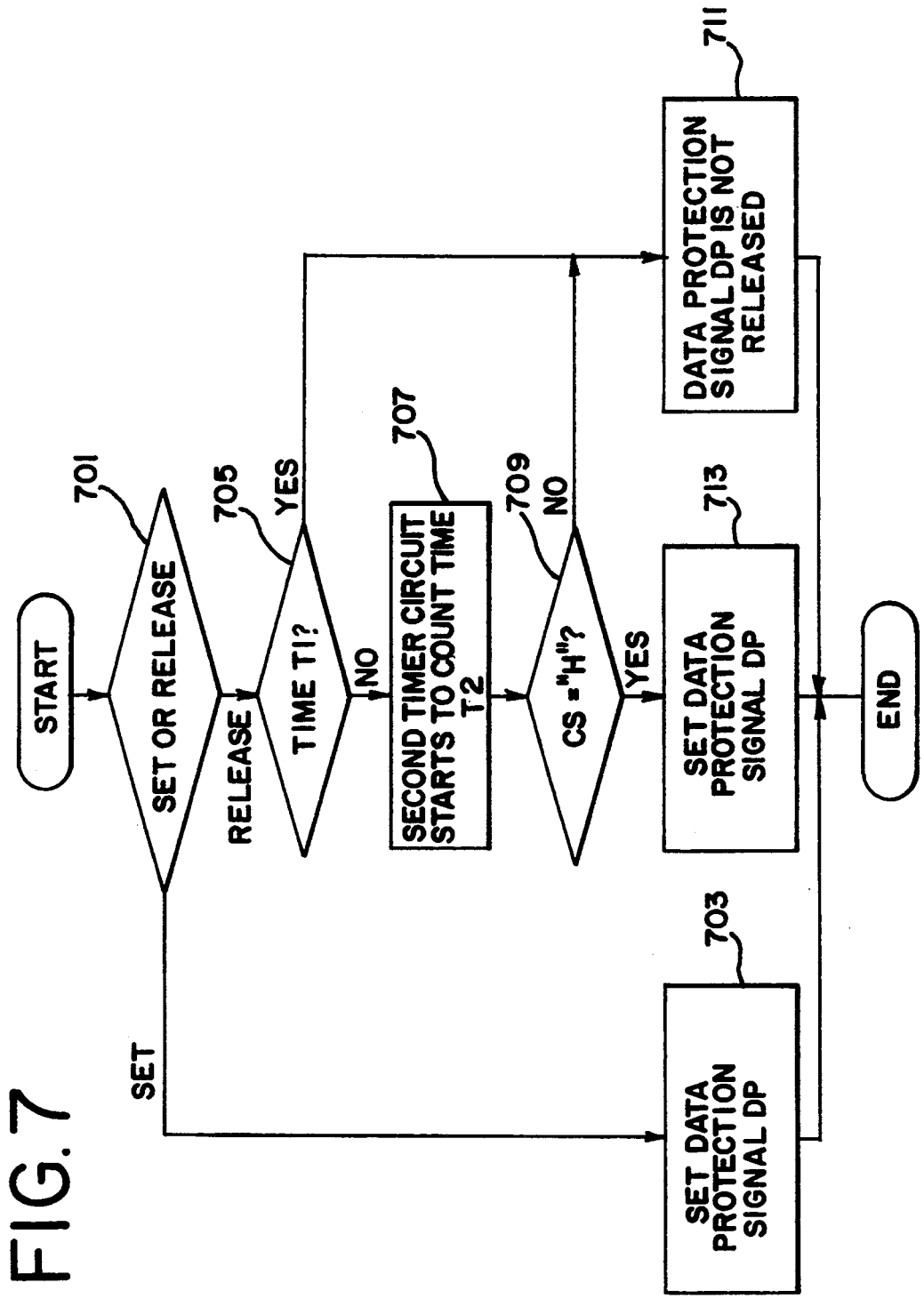
FIG. 7 is a flow chart showing a control operation of a data protection means according to a second embodiment of the present invention.
Figure 8:
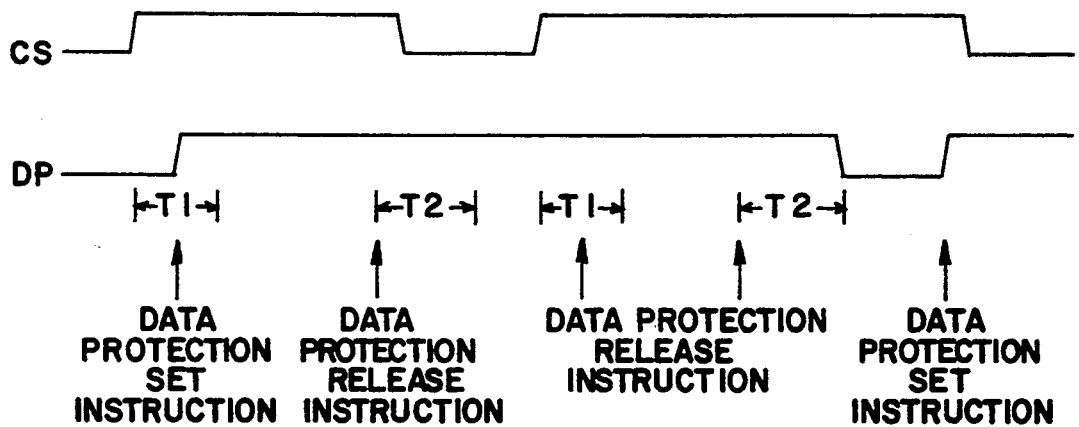
FIG. 8 is timing diagram showing an operation of the second embodiment of the present invention.

FIG. 7 is a flowchart showing an operation of the data write control means as illustrated in FIG. 3 and FIG. 8 is a timing mode of FIG. 7.

In this embodiment, an arrangement of the data protection circuit 536 as illustrated in FIG. 5 is modified in which the data protection set release signal Sa is input as it is to the data protection set release discriminating circuit 536b when the data protection set release signal Sa is at the setting instruction of the data protection (Sa="H"). The data protection set release discriminating circuit 536b sets the data protection signal DP directly by the output thereof to "H" level for thereby setting the data protection (Steps 701, 703 in FIG. 7). That is, as far as the setting instruction of the data protection is concerned, the data protection circuit 311 (FIG. 3) immediately sets the data protection signal DP irrespective of the content of the timing (T1, T2) by the first, second timer means as illustrated in FIGS. 3 and 5. In case that the releasing instruction of the data protection is excuted, the program proceeds to Step 705, and the data protection circuit 311 judges (Step 709) the level of the CS signal during the time interval T1 (Step 705) and after the lapse of the time interval T2 (Step 707). In case that the Cs signal is at "L" level, the program proceeds to Step 711 for thereby setting the data protection signal DP to "H" level. When the CS signal is judged as at "H" level in Step 709, the DP signal is released to "L" level (release) (Step 713).

In the second embodiment, the setting instruction for the data protection is excuted in a higher priority. Hence, inasmuch as the data write inhibited to be written it is possible to protect the data content by preventing the erroneous write caused by the switching of the power supply voltage variation or noise, etc. which occur at the time other than switching of the power supply voltage so that the fail-safe effect can be improved.

Figure 9:
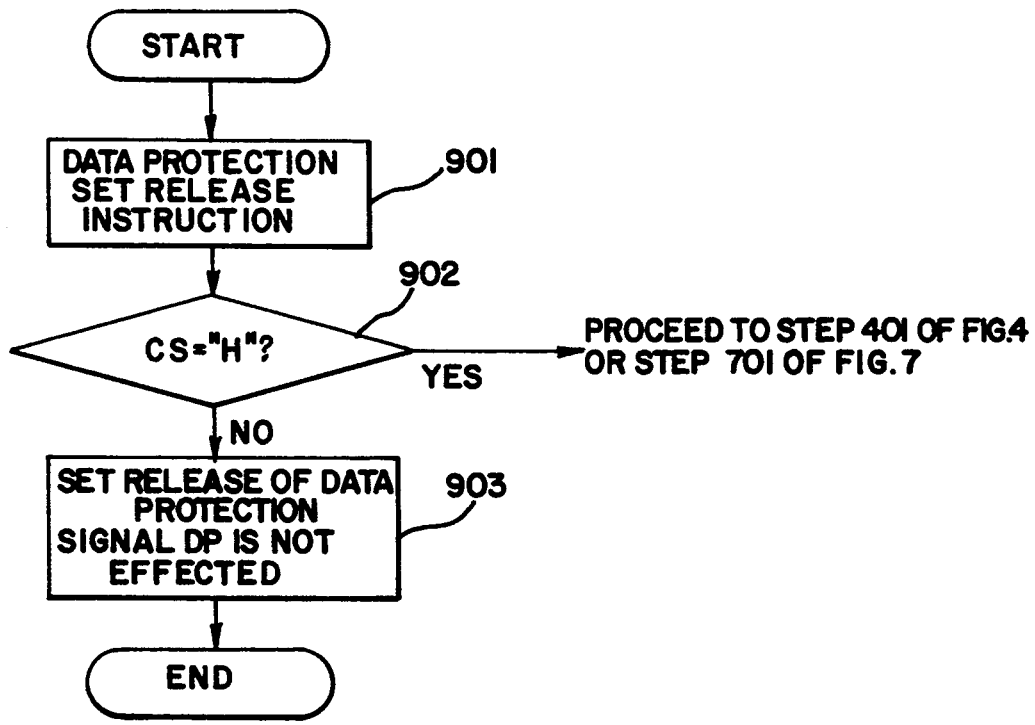
FIG. 9 is a flow chart showing a control operation of a data protection means according to a third embodiment of the present invention.

FIG. 9 is the flow chart showing a data write circuit according to a third embodiment of the present invention.

In the data write circuit, the arrangement of the data protection circuit 536 as illustrated in FIG. 5 is modified whereby when the data protection circuit 536 detects the data protection set release signal Sa (Step 901) the chip select signal CS (Step 902) is read. In case that the chip select signal CS is at "L" level, there is likelihood of occurrence of erroneous write so that the setting or releasing of the data protection is not effected (Step 903). In case that the chip select signal CS is at "H" level, the program proceeds to Step 401 as illustrated in FIG. 4 or Step 701 as illustrated in FIG. 7, and thereby operating in the same manner as the first and the second embodiments. Consequently, the processing can be simplified.

The present invention is not limited to the illustrated embodiments, for example, but can be variously modified such that the first timer means 315 as illustrated in FIG. 3 can be arranged by a counter, etc.

CAPABILITY OF EXPLOITATION IN INDUSTRY

As mentioned in detail above, according to the present invention, the data protection set release discriminating circuit judges as to whether the data protection control signal composed of the Sa and Sb signals provided by the processor, when the processor is at an abnormal state, i.e. when the main power supply voltage is cut off, is output or not below the operating assurance voltage of the processor on the basis of the level of the chip selet signal provided by the main power supply voltage monitoring circuit after the lapse of time T2. The data protection set release discriminating circuit detects the breakage of the main power supply voltage after the lapse of time T2 to enable the data protection control signal to output the data protection signal according to the data protectection control signal by the data protection circuit.

Accordingly, it is possible, according to the present invention, to protect the data holding circuit with assurance and prevent the data holding circuit from being destructive with assurance due to erroneous write control signal.

Furthermore, according to the first embodiment of the present invention, it is possible to protect the content of the data with accuracy caused by erroneous signal generated at the time of switching the power supply voltage. Still furthermore, the data protection signal is set or released after taking a predetermined procedure so that the erroneous operation of the data protection circuit per se can be prevented.

According to the second embodiment of the present invention has an arrangement that the data protection signal is forcibly set in case that the data protection setting instruction is executed, the data is inhibitted to be written by setting the data protection signal whereby the erroneous write signal generated at the time other than the switching of the power supply voltage can be protected at its stored data, thereby improving the fail-safe.

According to the third embodiment of the present invention, setting and releasing of the data protection signal is not effected in the case that the chip select signal is at "L" level at the time of application of the data protection set release signal whereby the process can be simplified .

What is claimed is:

1. A data write system for preventing a data store circuit from storing erroneous data therein so as to keep data stored therein while a data protect signal is generated, said data store circuit being supplied with a voltage by a power supply, comprising:

a power supply monitor coupled to the power supply for producing a first control signal selectively having first and second levels, the first level being produced when the voltage supplied from the power supply is greater than a predetermined level, the second level being produced when the voltage supplied from the power supply is less than or at the predetermined level;

a processor, connected to receive said voltage from the power supply, for generating a second control signal which has a data protect set mode and a data protect release mode and a third control signal which has a write permit mode and a write prohibit mode, in order to control said data store circuit;

a data protect setting and releasing circuit responsively coupled to said processor; and a data protect circuit responsively coupled to said data protect setting and releasing circuit and selectively generating the data protect signal which has a protect mode and a release mode;

said data protect setting and releasing circuit, when the second control signal has the data protect set mode and the third control signal has the write permit mode, setting said data protect circuit to generate the data protect signal having a protect mode only when the first control signal has the first level a predetermined first period of time after the third control signal has the write permit mode, and when the second control signal has the data protect release mode and the third control signal has the write permit mode, said data protect setting and releasing circuit further setting said data protect circuit to generate the data protect signal only when the first control signal has the first level the predetermined first period of time after the third control signal has the write permit mode, otherwise said protect setting and release circuit causing said data protect circuit to continue outputting the data protect signal.

2. A data write system according to claim 1, further comprising:

a backup power supply for supplying a backup power supply voltage to said data store circuit; and a switch circuit coupled to said power supply, said backup power supply, said data store circuit and said power supply monitor for connecting said power supply and said data store circuit when the first control signal has the first level, and connecting said backup power supply and said data store circuit when the first control signal has the second level.

3. A data write control system according to claim 1, wherein said data protect setting and releasing circuit does not detect the third control signal having the write permit mode during a second period of time from the first control signal being changed from the second level to the first level.

4. A data write control system comprising:

a power supply for supplying a power supply voltage;

a power supply monitor coupled to the power supply for producing a voltage level detecting signal having a first level when the power supply voltage is greater than a predetermined level and a second level when the power supply voltage is less than or at the predetermined level;

a processor coupled for receiving the power supply voltage, for generating a data protect setting and releasing signal having a protect set mode and a protect release mode, a protect writing signal having a write mode and a write prohibit mode and a write control signal;

a data protect circuit for generating a data protect signal having either a third level or a fourth level, the data protect circuit changing the level of the data protect signal corresponding to the mode of the data protect setting and releasing signal when the protect writing signal has the write mode and the voltage level detecting signal has the first level after a first period of time from detecting the write mode of the protect writing signal, otherwise said data protect circuit maintaining the level of the data protect signal;

a write control circuit coupled to said data protect circuit and said processor for generating a write enable signal in response to the write control signal when the data protect signal has the third level, said write control circuit generating a write prohibit signal when the data protect signal has the fourth level; and a data store circuit coupled to the write control circuit for writing data when the write enable signal is received thereto.

5. A data write control system according to claim 4, further comprising:

a backup power supply for supplying a backup power supply voltage to said data store circuit; and a switch circuit coupled to said power supply, said backup power supply, said data store circuit and said power supply monitor for connecting said power supply and said data store circuit when the voltage level detecting signal has the first level, and connecting said backup power supply and said data store circuit when the voltage level detecting signal has the second level.

6. A data write control system according to claim 4, wherein said data protect circuit does not detect the protect writing signal having the write mode during a second period of time from the voltage level detecting signal being changed from the second level to the first level.

7. A data write control system according to claim 6, wherein said data protect circuit has a first timer circuit for determining the second period of time.

8. A data write control system according to claim 6, wherein the first timer circuit has a rise time detecting circuit coupled to the power supply monitor for detecting that the voltage level detecting signal changes from the second level to the first level and a one shot pulse generator circuit for generating a one shot pulse signal in response to the detection of the level change.

9. A data write control system according to claim 4, wherein said data protect circuit has a second timer circuit for determining the first period of time.

10. A data write control system comprising:

a power supply for supplying a power supply voltage;

a power supply monitor coupled to the power supply for producing a voltage level detaching signal having a first level when the power supply voltage is greater than a predetermined level and a second level when the power supply voltage is less than or at the predetermined level;

a processor coupled for receiving the power supply voltage, for generating a data protect setting and releasing signal having a protect set mode and a protect release mode, a protect writing signal having a write mode and a write prohibit mode and a write control signal;

a data protect set and release discriminating circuit coupled to said processor and said power supply monitor for generating a discriminating signal having the protect mode when the data protect setting and releasing signal has a protect set mode and the protect writing signal has the write mode, said data protect set and release discriminating circuit generating the discriminating signal having a release mode when the data protect setting and releasing signal has the protect release mode and the protect writing signal has the write mode;

a data protect signal generating circuit coupled to said data protect set and release discriminating circuit for generating a data protect signal having either a third level or a fourth level, said data protect signal generating circuit generating the data protect signal having the third level where the voltage level detecting signal has the first level a predetermined time after the discriminating signal has the protect mode, said data protect signal generating circuit generating the data protect signal having the fourth level where the voltage level detecting signal has the first level the predetermined time after the discriminating signal has the release mode;

a write control circuit coupled to said data protect signal generating circuit and said processor for generating a write enable signal in response to the write control signal and the data protect signal having the third level, said write control circuit generating a write prohibit signal in response to the data protect signal having the fourth level; and a data store circuit coupled to the write control circuit for storing data in response to the write enable signal.

11. A data write control system according to claim 10, further comprising:

a backup power supply for supplying a backup power supply voltage to said data store circuit; and a switch circuit coupled to said power supply, said backup power supply, said data store circuit and said power supply monitor for connecting said power supply and said data store circuit when the voltage level detecting signal has the first level, and connecting said backup power supply and said data store circuit when the first control signal has the second level.

12. A data write control system according to claim 10, further comprising a first timer circuit coupled to said processor and said power supply monitor for prohibiting the transmission of the protect writing signal during a period of time from the voltage level detecting signal being changed from the second level to the first level.

13. A data write control system according to claim 10, wherein said first timer comprises:

a rising edge detecting circuit coupled to the power supply monitor for outputting a detect signal when the level of the voltage level detecting signal changes from the second level to the first level;

a first one shot pulse generating circuit coupled to said rising edge detecting circuit for outputting a first one shot pulse signal having a pulse width corresponding to the period of time in response to the detect signal; and a first gate circuit coupled to said processor, said first one shot pulse generating circuit and said data protect set and release discriminating circuit, for prohibiting transmission of the protect writing signal from said processor to said data protect set and release discriminating circuit therethrough in response to the first one shot pulse signal.

14. A data write control system according to claim 13, wherein said data protect signal generating circuit comprises:

an oscillator for generating a clock signal;

a first counter circuit coupled to said data protect set and release discriminating circuit and said oscillator for generating a first count signal the predetermined time after the discriminating signal has the protect mode;

a second counter circuit coupled to said data protect set and release discriminating circuit and said oscillator for generating a second count signal the predetermined time after the discriminating signal has the release mode;

a second one shot pulse generating circuit coupled to the first counter for outputting a second one shot pulse signal in response to the first count signal;

a third one shot pulse generating circuit coupled to the second counter for outputting a third one shot pulse signal in response to the second count signal;

a second gate circuit coupled to said power supply monitor and said second one shot pulse generating circuit for transmitting the second one shot pulse signal therethrough in response to the voltage level detecting signal having the first level signal;

a third gate circuit coupled to said power supply monitor and said third one shot pulse generating circuit for transmitting the third one shot pulse signal therethrough in response to the voltage level detecting signal having the first level signal; and a latch circuit coupled to said second and third gate circuits for outputting the data protect signal in response to the second and third one shot pulse signal.

15. A data write control system according to claim 44, wherein said latch circuit is an RS flip-flop.

16. A data write control system according to claim, 14, wherein said write control circuit comprises:

a fourth gate circuit coupled to said processor and said power supply monitor for transmitting the write control signal therethrough in response to the voltage level detecting signal having the first level, otherwise said fourth gate circuit outputting the write prohibit signal; and a fifth gate circuit coupled to said fourth gate circuit and said data protect signal generating circuit for transmitting an output signal of said fourth gate circuit in response to the data protect signal having the third level, said fifth gate circuit generating the write prohibit signal in response to the data protect signal having the fourth level.

17. A data write control system according to claim 16, wherein said fourth gate circuit comprises:

an inverter having an input coupled to the processor and an output; and a NAND gate having a first input coupled to the power supply monitor, and a second input coupled to the output of said inverter and output.

18. A data write control system according to claim 17, wherein said fifth gate circuit includes an OR gate having a first input coupled to the output of said NAND gate, a second input coupled to said data protect signal generating circuit and an output.

* * * * *